United States Patent
Ebergen et al.

(10) Patent No.: US 7,064,583 B1
(45) Date of Patent: Jun. 20, 2006

(54) ARBITERS WITH PREFERENTIAL ENABLES FOR ASYNCHRONOUS CIRCUITS

(75) Inventors: Jo C. Ebergen, San Francisco, CA (US); Ivan E. Sutherland, Santa Monica, CA (US); Bernard Tourancheau, Miribel (FR)

(73) Assignee: SUN Microsystems, Inc., Santa Clara, CA (US)

( * ) Notice: Subject to any disclaimer, the term of this patent is extended or adjusted under 35 U.S.C. 154(b) by 110 days.

(21) Appl. No.: 10/922,744

(22) Filed: Aug. 19, 2004

(51) Int. Cl.
*H03K 19/20* (2006.01)

(52) U.S. Cl. .......................... 326/104; 326/93; 326/52; 710/240

(58) Field of Classification Search .................. 326/52, 326/93–98, 104, 105, 112, 119, 121; 327/18, 327/19; 710/112, 113, 240

See application file for complete search history.

(56) References Cited

U.S. PATENT DOCUMENTS

| | | | | | |
|---|---|---|---|---|---|
| 4,864,243 | A | * | 9/1989 | Reese | 327/19 |
| 5,341,052 | A | * | 8/1994 | Dike et al. | 327/19 |
| 5,713,025 | A | * | 1/1998 | Molnar et al. | 710/241 |
| 2004/0156323 | A1 | * | 8/2004 | Cao | 370/258 |
| 2004/0243752 | A1 | * | 12/2004 | O'Connor et al. | 710/243 |

* cited by examiner

*Primary Examiner*—Don Le
(74) *Attorney, Agent, or Firm*—Park, Vaughan & Fleming LLP

(57) ABSTRACT

One embodiment of the present invention provides a circuit that preferentially grants requests. This circuit monitors at least two inputs for request signals and at least two inputs for enable signals, wherein each request signal is associated with a corresponding enable signal. If any enable signal is asserted and only one request signal is asserted, the circuit asserts a grant signal associated with the asserted request signal. Otherwise, if a single enable signal is asserted and multiple request signals are asserted, the circuit preferentially asserts the grant signal of the request signal associated with the asserted enable signal.

24 Claims, 3 Drawing Sheets

OPTIMIZED CROSS-
COUPLED GATES
300

ARBITERS WITH PREFERENTIAL ENABLES FOR ASYNCHRONOUS CIRCUITS

BACKGROUND

1. Field of the Invention

The present invention relates to the design of asynchronous circuits. More specifically, the present invention relates to the design of arbiters with preferential enables for asynchronous circuits.

2. Related Art

Many computer systems have a router that controls traffic between a pool of servers and a queue of clients (see FIG. 1B). In a generic case, a client sends a request for service to the router and the router selects a server to provide the service.

Normally a router contains an arbiter (see FIG. 1A) which selects a server to service the next client request. An arbiter is a device that grants requests, one at a time, from any number of requesters. Although arbiters for three or more requestors exist, most arbiters are "binary arbiters," which choose between two requesters. When there is only one request pending for a binary arbiter, the arbiter grants that request. When there are two requests pending, the arbiter makes a decision about which of two requests to grant first. In a typical system, after the arbiter grants a request, the environment eventually releases the grant by lowering the request input. The arbiter then acknowledges the release of the request by lowering the grant output. At this point, the arbiter may grant a subsequent request.

Designing reliable implementations of arbiters requires extra care, because such implementations can exhibit meta-stable behavior. Today, however, reliable circuit implementations of binary arbiters are well understood. Some circuit implementations of arbiters include cross-coupled NAND gates followed by some filter to delay the output until meta-stable behavior is over (see FIG. 1A).

Unfortunately, routing client requests to servers is not always this easy. Differing client requirements for servers can also create problems in designing a suitable hardware implementation for a router. Some clients can accept service from any available server, while other clients must be served by a particular server. In some systems, an arbiter may choose a server to service the next client request before the next client request has arrived. Such eager decisions may lead to an error, for example when the arbiter decides to send the next client request to server A, while that client requires service only from server B. An error can also occur when, upon arrival of a client request, both servers are available and the arbiter chooses a server that is different from the one preferred by the client.

Hence, what is needed is an arbiter that makes routing decisions which are consistent with requirements and/or preferences of clients.

Further complicating the problem is the need for a fast solution. Conventional binary arbiters (such as the arbiter illustrated in FIG. 1A) have a delay of about two gate delays in the uncontested case.

Hence, what is needed is an arbiter that makes routing decisions based on client requirements and/or preferences, and that operates with a similar number of gate delays.

SUMMARY

One embodiment of the present invention provides a circuit that preferentially grants requests. This circuit monitors at least two inputs for request signals and at least two inputs for enable signals, wherein each request signal is associated with a corresponding enable signal. If any enable signal is asserted and only one request signal is asserted, the circuit asserts a grant signal associated with the asserted request signal. Otherwise, if a single enable signal is asserted and multiple request signals are asserted, the circuit preferentially asserts the grant signal of the request signal associated with the asserted enable signal.

In a variation of this embodiment, if the request signal associated with the enable signal is not asserted when multiple request signals are asserted, the circuit asserts a grant signal associated with one of the asserted request signals.

In a variation of this embodiment, when the circuit asserts a grant signal for a request signal when the associated enable signal is asserted, the grant signal switches quickly, but when the circuit asserts a grant signal for a request signal when a non-associated enable signal is asserted, the grant signal switches slowly.

In a variation of this embodiment, once a grant signal is asserted, the circuit de-asserts the enable signal to avoid incorrectly asserting the grant signal for a subsequent request signal.

In a variation of this embodiment, the circuit de-asserts the granted request signal after the enable signal is de-asserted.

In a variation of this embodiment, the circuit de-asserts the grant signal after the enable signal is de-asserted.

In a variation of this embodiment, the circuit filters the grant signals to protect downstream circuitry from meta-stable grant signals.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

Arbiter with Preferential Enables

Figure 1A:
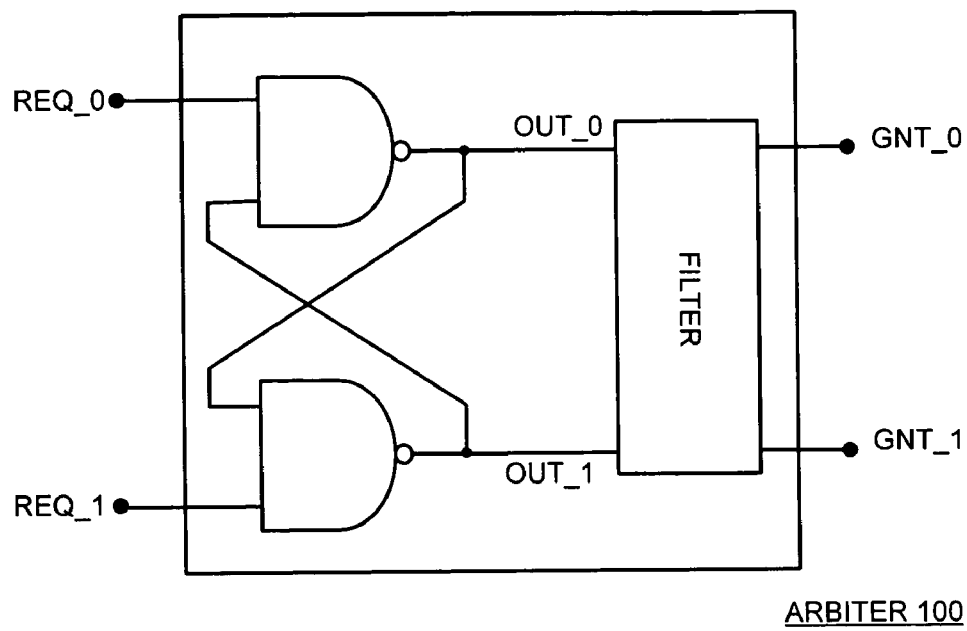
FIG. 1A illustrates a simple arbiter.
Figure 1B:
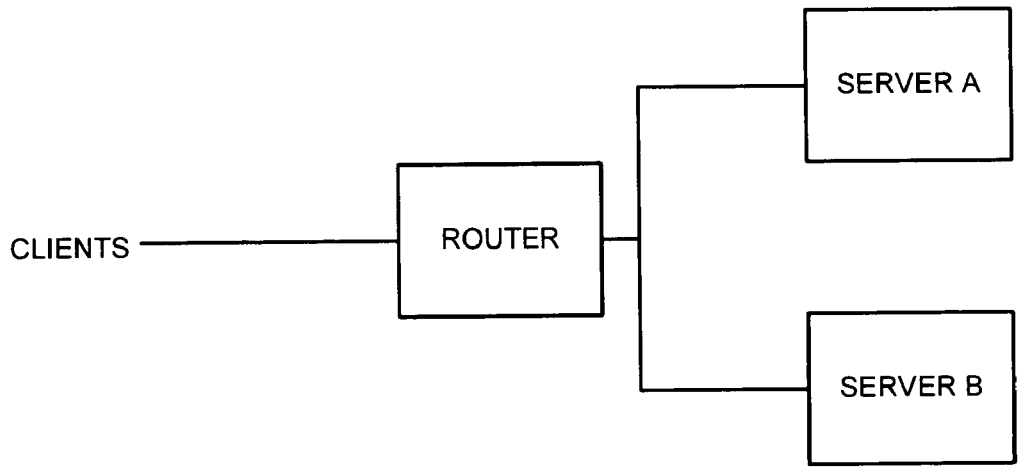
FIG. 1B illustrates a computer system that uses a router to assign service requests from a queue of clients to two servers.
Figure 2A:
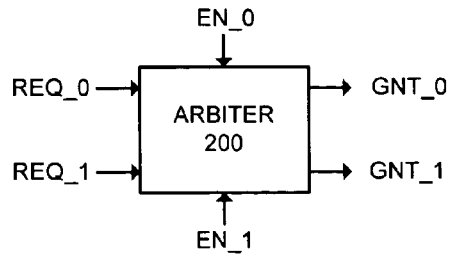
FIG. 2A illustrates an arbiter with preferential enables in accordance with an embodiment of the present invention.

FIG. 2A illustrates an arbiter with preferential enables in accordance with an embodiment of the present invention. An arbiter with preferential enables receives two or more enable signals which the arbiter uses to determine how to grant requests.

Arbiter 200 grants requests (REQ_0 and REQ_1), one at a time, from either of two requesters. Arbiter 200 requires exactly one preferential enable signal (EN_0 or EN_1) to be asserted before a grant signal (GNT_0 or GNT_1) can be asserted.

If only enable signal EN_0 is asserted, the asynchronous circuit has a preference for granting request signal REQ_0, but the asynchronous circuit can be satisfied with request signal REQ_1. In other words, if enable signal EN_0 is asserted and REQ_0 is asserted alone or REQ_0 and REQ_1 are both asserted, request signal REQ_0 is granted. However, if enable signal EN_0 is asserted and only REQ_1 is asserted, then REQ_1 is granted.

Following the assertion of a grant signal, arbiter 200 requires the asynchronous circuit to de-assert the enable signal and then de-assert the corresponding request signal. If a request signal is de-asserted while the enable signal remains asserted, arbiter 200 may incorrectly assert the grant signal for subsequently asserted request signals, which can cause errors in downstream circuitry.

Arbiter Gate-Level View

Figure 2B:
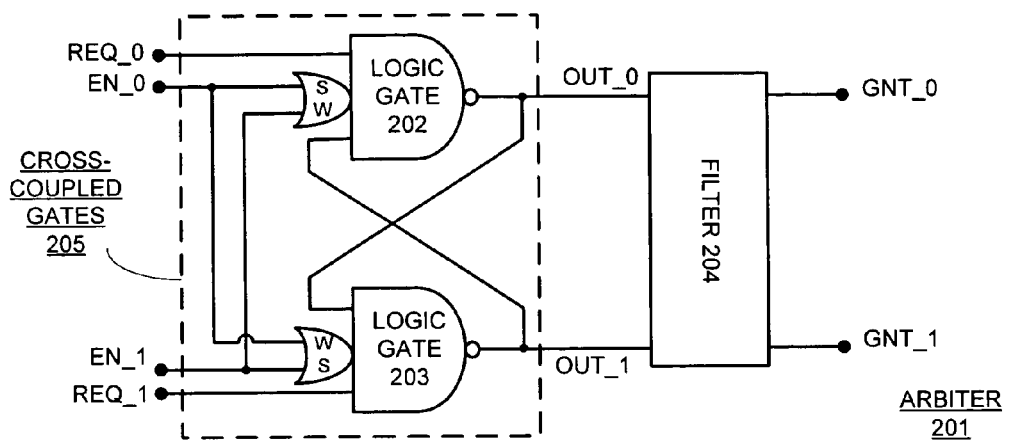
FIG. 2B illustrates a gate-level view of an arbiter in accordance with an embodiment of the present invention.

FIG. 2B illustrates a gate-level view of an arbiter in accordance with an embodiment of the present invention. Arbiter 201 includes logic gates 202 and 203 as well as filter 204. Note that logic gates 202 and 203 are cross-coupled.

Arbiter 201 has two preferential enable inputs, EN_0 and EN_1. Both EN_0 and EN_1 are coupled to logic gates 202 and 203, but each gate is coupled differently. More specifically, EN_0 is coupled to both the strong input of logic gate 202 and the weak input of logic gate 203. By coupling to inputs of both logic gates 202 and 203, EN_0 can enable either logic gate. However, EN_0 'prefers' logic gate 202. In other words, the arbiter may grant either request when the asynchronous circuit asserts EN_0, but the arbiter preferentially grants REQ_0 when both requests arrive before the enable signal.

Note that, although the enable signals can influence the outcome of the decision of arbiter 201, meta-stable behavior can still occur. Meta-stable behavior occurs when a first request is asserted, an enable signal arrives that prefers a request different from the first requester, and slightly later the second request arrives. The arrival times and strengths of the pull-down transistors all play a role in determining whether meta-stable behavior occurs and how long meta-stability will persist.

Note also that while the values on the outputs of cross-coupled gates 205 are meta-stable, filter 204 prevents the values from being propagated to downstream circuitry, thereby protecting the downstream circuits from errors caused by the meta-stability.

Cross-Coupled Gates Transistor-Level View

Figure 2C:
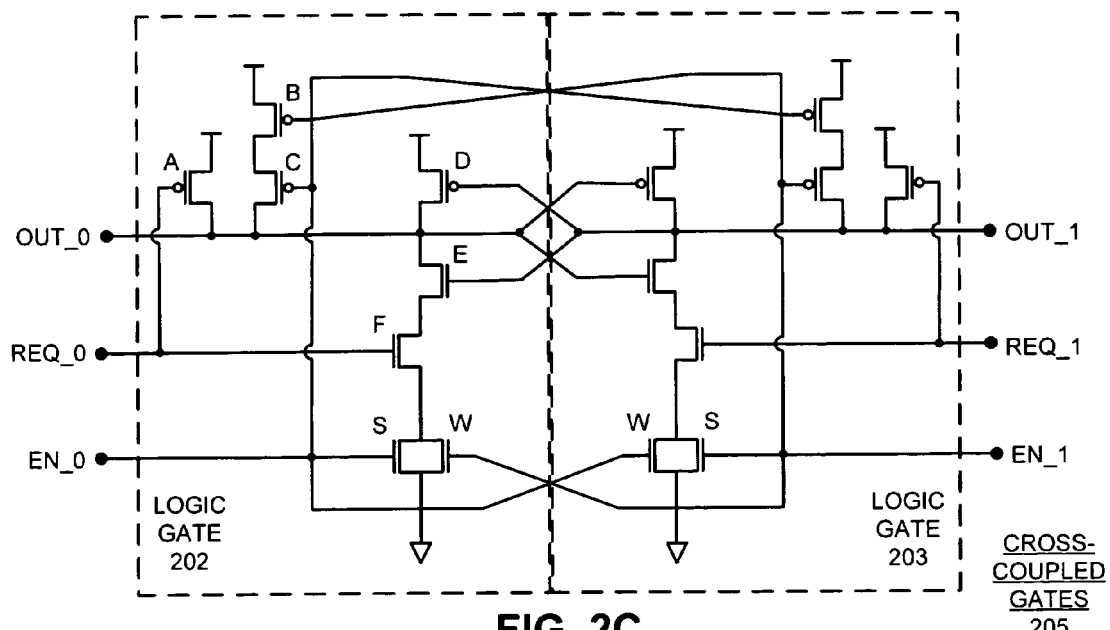
FIG. 2C illustrates a transistor-level view of part of an arbiter in accordance with an embodiment of the present invention.

FIG. 2C illustrates a transistor-level view of cross-coupled gates 205 in accordance with an embodiment of the present invention. Cross-coupled gates 205 include two identical circuit structures that implement logic gate 202 and logic gate 203 (see FIG. 2B).

Cross-coupled gates 205 contain two pull-down stacks. In each pull-down stack there are two transistors in parallel connected to the enable signals, one for each enable input. Each enable input connects to one "strong" (i.e. large) transistor and one "weak" (i.e. small) transistor. The enable input with preference for request REQ_0 connects to a strong transistor in the pull-down stack that leads to output OUT_0 and a weak transistor in the pull-down stack that leads to output OUT_1. Because of this asymmetry in the enable inputs, when both REQ_0 and REQ_1 and EN_0 are asserted, cross-coupled gates 205 will quickly decide in favor of REQ_0. A similar reasoning applies when both REQ_0 and REQ_1 are asserted and EN_1 is asserted, where this time cross-coupled gates 205 quickly decide in favor of REQ_1. When only one of REQ_0 or REQ_1 is asserted and one enable is asserted, cross-coupled gates 205 will decide in favor of the single requestor. The decision will be made quickly if the enable and requester match, and the decision will be made slightly more slowly if the enable and requestor differ.

An Optimization for the Cross-Coupled Gates

Figure 3:
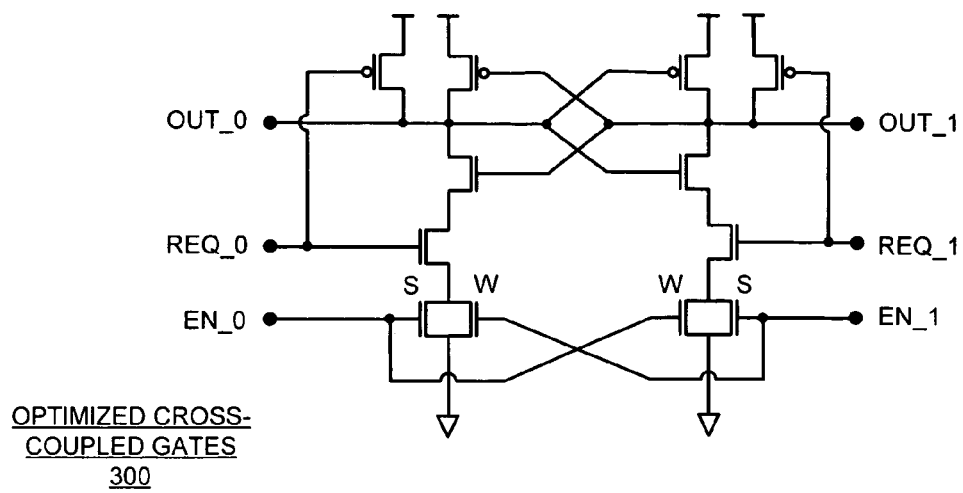
FIG. 3 illustrates an transistor-level view of part of an optimized arbiter in accordance with an embodiment of the present invention.

FIG. 3 illustrates an optimized implementation of cross-coupled gates in accordance with an embodiment of the present invention. Note that optimized cross-coupled gates 300 are the same as cross-coupled gates 205 from FIG. 2 with selected PMOS transistors removed.

Note that the existence of excessive PMOS transistors in a circuit element leads to high values for the logical effort associated with that circuit element. High values for logical effort mean that larger driving transistor sizes are required to maintain switching speed. Conversely, low values of logical effort result in faster switching speed for the same driving transistor sizes.

As mentioned in the preceding discussion, each granted request signal is de-asserted following the de-assertion of the enable signal. Consequently, in cross-coupled gates 205 the PMOS transistors coupled to the enable signals duplicate the work performed by the PMOS device connected to the request signal. To avoid the redundancy, the PMOS devices coupled to the enable signal are removed in optimized cross-coupled gates 300. Therefore, the logical effort associated with optimized cross-coupled gates 300 is lower than cross-coupled gates 205.

A GasP Circuit Application

Figure 4:
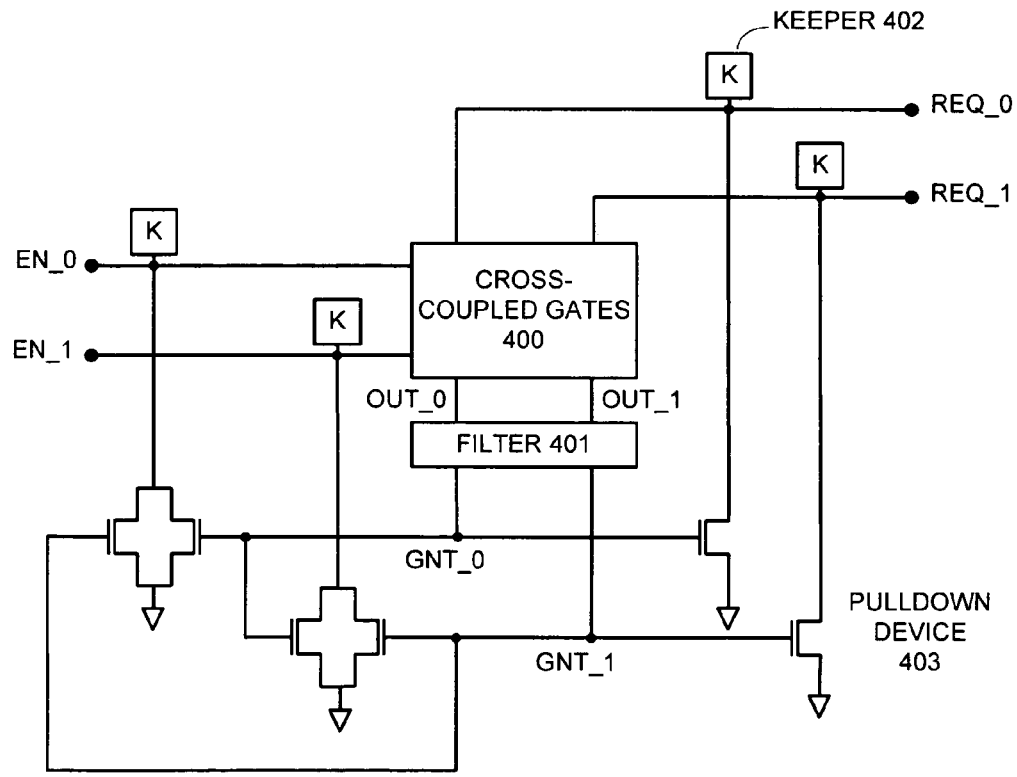
FIG. 4 illustrates an application of an arbiter in a circuit in accordance with an embodiment of the present invention.

FIG. 4 illustrates an application of an arbiter in a circuit in accordance with an embodiment of the present invention. Arbiter 400 and filter 401 appear in a GasP implementation of the control for a router with a single client and two servers. GasP modules are described in more detail in a U.S. Pat. No. 6,707,317 entitled, "Method and Apparatus for Asynchronously Controlling Domino Logic Gates," by Ebergen, et al., which is hereby incorporated by reference to describe implementation details of GasP modules.

In the GasP module, when the arbiter has decided which request to grant, both enable signals and the granted request signal are reset by one or more pull-down devices (such as pull-down device 403). When the enable signal is de-asserted, the arbiter responds by de-asserting the grant signal.

Note that the pull-down devices for the enable signals are driven by both grant signals. This follows the requirement that the arbiters be able to grant a request for a request signal that is not associated with the enable signal. After granting any request, the asynchronous circuit must de-assert whichever enable signal enabled the assertion of the grant signal to prevent erroneous values from appearing on the output of the arbiter.

Note also that keepers (such as keeper 402) maintain the state of the enable and request signal nodes, but the transistors in the keepers are sized so that the nodes are switched easily by driving elements.

The foregoing descriptions of embodiments of the present invention have been presented for purposes of illustration and description only. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for preferentially granting requests in an asynchronous circuit, comprising;
   monitoring at least two inputs for request signals and at least two inputs for enable signals, wherein each request signal is associated with an enable signal;
   if any enable signal is asserted and only one request signal is asserted, asserting a grant signal associated with the asserted request signal; and
   if a single enable signal is asserted and multiple request signals are asserted, preferentially asserting the grant signal of the request signal associated with the asserted enable signal.

2. The method of claim 1, wherein if the request signal associated with the enable signal is not asserted when multiple request signals are asserted, the method further comprises asserting a grant signal associated with one of the asserted request signals.

3. The method of claim 1, wherein when asserting a grant signal for a request signal when the associated enable signal is asserted, the grant signal switches quickly, but when asserting a grant signal for a request signal when a non-associated enable signal is asserted, the grant signal switches slowly.

4. The method of claim 1, wherein once a grant signal is asserted, the method further comprises de-asserting the enable signal to avoid incorrectly asserting the grant signal for a subsequent request signal.

5. The method of claim 4, wherein the method further comprises de-asserting the granted request signal after the enable signal is de-asserted.

6. The method of claim 4, wherein the method further comprises de-asserting the grant signal after the enable signal is de-asserted.

7. The method of claim 1, wherein the method further comprises filtering the grant signals to protect downstream circuitry from a meta-stable grant signal.

8. An asynchronous circuit for preferentially granting requests, comprising:
   at least two logic gates;
   wherein each logic gate accepts a request signal, at least two enable signals and at least one feedback signal as inputs and drives a single output signal; and
   wherein each logic gate includes a circuit element which preferentially grants the request signal for that gate when the enable signal associated with that request is asserted.

9. The asynchronous circuit of claim 8,
   wherein the circuit element within each logic gate includes one strong transistor and at least one weak transistor in parallel,
   wherein the gate of the strong transistor is coupled to the enable signal associated with the request signal for that logic gate; and
   wherein the gate of each weak transistor is coupled to the enable signal associated with the request signal for another logic gate.

10. The asynchronous circuit of claim 9,
    wherein coupling the enable signal associated with the request signal for the logic gate to the strong transistor causes the grant signal to be asserted more quickly when the enable signal for that gate is asserted; and
    wherein coupling an enable signal associated with a request signal for another logic gate to a weak transistor causes the grant signal to be asserted more slowly when the enable signal for another gate is asserted.

11. The asynchronous circuit of claim 9, wherein coupling each enable signal to the circuit element within each logic gate allows any asserted enable signal to enable any one of the grant signals.

12. The asynchronous circuit of claim 8, wherein the output of each logic gate is coupled to a feedback input on at least one other logic gate, thereby forming a set of cross-coupled gates.

13. The asynchronous circuit of claim 8, wherein the enable signal must be de-asserted before the request signal is de-asserted.

14. The asynchronous circuit of claim 8,
    wherein the asynchronous circuit includes a filter circuit;
    wherein the filter circuit accepts output signals from the logic gates as inputs and drives grant signals as outputs.

15. The asynchronous circuit of claim 14,
    wherein the cross-coupled gates and the filter circuit assert only one output signal at a time; and
    wherein the filter circuit prevents meta-stable signals on the outputs of the logic gates from passing through to the outputs of the filter circuit.

16. An apparatus for preferentially granting requests, comprising:
    at least two logic gates;
    wherein each logic gate accepts a request signal, at least two enable signals and at least one feedback signal as inputs and drives a single output signal; and
    wherein each logic gate includes a circuit element which preferentially grants the request signal for that gate when the enable signal associated with that request is asserted.

17. The apparatus circuit of claim 16,
    wherein the circuit element within each logic gate includes one strong transistor and at least one weak transistor in parallel,
    wherein the gate of the strong transistor is coupled to the enable signal associated with the request signal for that logic gate; and
    wherein the gate of each weak transistor is coupled to the enable signal associated with the request signal for another logic gate.

18. The apparatus of claim 17,
    wherein coupling the enable signal associated with the request signal for the logic gate to the strong transistor causes the grant signal to be asserted more quickly when the enable signal for that gate is asserted; and
    wherein coupling an enable signal associated with a request signal for another logic gate to a weak transistor causes the grant signal to be asserted more slowly when the enable signal for another gate is asserted.

19. The apparatus of claim 17, wherein coupling each enable signal to the circuit element within each logic gate allows any asserted enable signal to enable any one of the grant signals.

20. The apparatus of claim 16, wherein the output of each logic gate is coupled to a feedback input on at least one other logic gate, thereby forming a set of cross-coupled gates.

21. The apparatus of claim 16, wherein the enable signal must be de-asserted before the request signal is de-asserted.

22. The apparatus of claim 16, wherein the asynchronous circuit includes a filter circuit;

wherein the filter circuit accepts output signals from the logic gates as inputs and drives grant signals as outputs.

23. The apparatus of claim 22, wherein the cross-coupled gates and the filter circuit assert only one output signal at a time; and wherein the filter circuit prevents meta-stable signals on the outputs of the logic gates from passing through to the outputs of the filter circuit.

24. A computer system including an asynchronous circuit for preferentially granting requests, comprising:

at least two logic gates;

wherein each logic gate accepts a request signal, at least two enable signals and at least one feedback signal as inputs and drives a single output signal; and wherein each logic gate includes a circuit element which preferentially grants the request signal for that gate when the enable signal associated with that request is asserted.

* * * * *